United States Patent
Dhondse et al.

(10) Patent No.: US 10,832,315 B2
(45) Date of Patent: Nov. 10, 2020

(54) IMPLEMENTING COGNITIVE MODELING TECHNIQUES TO PROVIDE BIDDING SUPPORT

(71) Applicant: International Business Machines Corporation, Armonk, NY (US)

(72) Inventors: Amol A. Dhondse, Pune (IN); Anand Pikle, Pune (IN); Laura I. Rusu, Endeavour Hills (AU); Gandhi Sivakumar, Bentleigh (AU)

(73) Assignee: International Business Machines Corporation, Armonk, NY (US)

( * ) Notice: Subject to any disclaimer, the term of this patent is extended or adjusted under 35 U.S.C. 154(b) by 508 days.

(21) Appl. No.: 15/398,202

(22) Filed: Jan. 4, 2017

(65) Prior Publication Data

US 2018/0189866 A1 Jul. 5, 2018

(51) Int. Cl.
*G06N 20/00* (2019.01)
*G06Q 30/08* (2012.01)
*G06F 30/20* (2020.01)

(52) U.S. Cl.
CPC .......... *G06Q 30/08* (2013.01); *G06F 30/20* (2020.01); *G06N 20/00* (2019.01)

(58) Field of Classification Search
None
See application file for complete search history.

(56) References Cited

U.S. PATENT DOCUMENTS

| | | | |
|---|---|---|---|
| 4,697,242 A * | 9/1987 | Holland | G06K 9/6229 706/13 |
| 6,499,018 B1 | 12/2002 | Alaia et al. | |
| 7,493,280 B2 | 2/2009 | Guler et al. | |
| 7,801,802 B2 | 9/2010 | Walker et al. | |
| 8,230,362 B2 * | 7/2012 | Couch | G01M 17/00 715/852 |
| 8,438,074 B2 * | 5/2013 | Serbanescu | G06Q 30/0601 705/26.4 |
| 9,712,576 B1 * | 7/2017 | Gill | G06N 5/04 |
| 2001/0039531 A1 * | 11/2001 | Aoki | G06Q 30/08 705/37 |
| 2002/0147675 A1 | 10/2002 | Das et al. | |
| 2002/0174052 A1 | 11/2002 | Guler et al. | |
| 2003/0036964 A1 * | 2/2003 | Boyden | G06Q 30/0609 705/26.3 |
| 2003/0046689 A1 * | 3/2003 | Gaos | G06O 30/02 725/34 |
| 2003/0182222 A1 * | 9/2003 | Rotman | G06Q 10/08345 705/37 |
| 2003/0220773 A1 * | 11/2003 | Haas | G06Q 10/0637 703/2 |

(Continued)

*Primary Examiner* — William J Jacob
(74) *Attorney, Agent, or Firm* — Joseph Petrokaitis; Ryan, Mason & Lewis, LLP

(57) ABSTRACT

A method for providing bidding support to a user during an auction using cognitive modeling comprises obtaining data associated with the auction, with the obtained data comprising data associated with at least one bidder. The obtained data is analyzed, and at least one output is generated based on the analysis. The at least one output is sent to at least one device associated with the user. The at least one device is configured to generate at least one alert based on the at least one output, with the at least one alert providing decision support to the user with respect to bidding strategy.

20 Claims, 6 Drawing Sheets

(56) References Cited

U.S. PATENT DOCUMENTS

| | | | |
|---|---|---|---|
| 2005/0144081 A1 | 6/2005 | Guler et al. | |
| 2005/0240507 A1* | 10/2005 | Galen | G06Q 30/0635 |
| | | | 705/37 |
| 2007/0027864 A1* | 2/2007 | Collins | G06Q 30/0211 |
| 2007/0078849 A1* | 4/2007 | Slothouber | G06F 16/9535 |
| 2008/0235113 A1* | 9/2008 | Rabenold | G06Q 30/0641 |
| | | | 705/26.3 |
| 2010/0082433 A1* | 4/2010 | Zhou | G06Q 30/0256 |
| | | | 705/14.54 |
| 2012/0284080 A1* | 11/2012 | De Oliveira | H04W 4/21 |
| | | | 705/7.29 |
| 2013/0073413 A1 | 3/2013 | Bhogal et al. | |
| 2014/0164162 A1* | 6/2014 | Rabenold | G06Q 30/08 |
| | | | 705/26.3 |
| 2014/0279163 A1 | 9/2014 | Gladis et al. | |
| 2016/0180240 A1* | 6/2016 | Majumdar | G06N 3/006 |
| | | | 706/46 |
| 2017/0337287 A1* | 11/2017 | Gill | G06N 5/04 |
| 2018/0033081 A1* | 2/2018 | Karas | G06Q 30/08 |

\* cited by examiner

IMPLEMENTING COGNITIVE MODELING TECHNIQUES TO PROVIDE BIDDING SUPPORT

BACKGROUND

Four traditional auction types include the open ascending price auction (i.e., English auction), the open descending price auction (i.e., Dutch auction), the sealed-bid first-price auction, and the sealed-bid second-price auction (i.e., Vickrey auction). In the English auction type, bidders bid openly against each other, and each bid must be higher than the previous bid. In the Dutch auction type, the auction starts at a high asking price and is lowered until a bidder is willing to accept the price. In the sealed-bid first-price auction type, all bidders simultaneously submit respective secret sealed bids, and the bidder with the highest bid pays his or her own bid. In the Vickrey auction type, all bidders simultaneously submit respective secret sealed bids, and the bidder with the highest bid pays the second-highest bid rather than his or her own.

Among risk-averse bidders, Dutch and first-price sealed-bid auction types may provide a higher expected value to the auctioneer than the Vickrey or English auction types. For example, in the Dutch and first-price sealed-bid auction types, a risk-averse bidder can provide self-insurance by bidding more than what is optimal for a risk-neutral bidder. Additionally, a risk-averse auctioneer may achieve higher expected value via the Vickrey or English auction types than via the Dutch or the first-price-sealed bid auction types, assuming that the bidders are risk-neutral.

In a private value auction model, each bidder knows how much he or she privately values the item up for auction. Thus, in the private value auction model, the value assigned by a bidder would be unaffected based on the bidding behavior of other bidders. However, in a common value auction model, the actual value of an item up for auction (e.g., market value of the item) is identical amongst the bidders, but each bidder has different private information about what the actual value of the item is. For instance, all of the bidders in the common value auction model may assign the same value for the item, but the variance may differ based on the type of auction (e.g., English, Dutch, first-price sealed-bid, and Vickrey). Accordingly, a bidder in the common value auction model may change his or her estimate of the value based on information obtained based on the bidding behavior of other bidders at the auction.

SUMMARY

Illustrative embodiments of the invention provide techniques for vicinity based cognitive bidding. While illustrative embodiments are well-suited to provide vicinity based cognitive bidding support, alternative embodiments may be implemented.

For example, in one illustrative embodiment, a method for a cognitive bidding engine associated with a user providing bidding support to the user during an auction using cognitive modeling comprises obtaining data associated with the auction, with the obtained data comprising data associated with at least one bidder. The obtained data is analyzed, and at least one output is generated based on the analysis. The at least one output is sent to at least one device associated with the user. The at least one device is configured to generate at least one alert based on the at least one output, with the at least one alert providing decision support to the user with respect to bidding strategy. The cognitive bidding engine is in communication with at least one processing device operatively coupled to memory.

For example, in another illustrative embodiment, a computer program product to provide, by a cognitive bidding engine associated with a user, bidding support to the user during an auction using cognitive modeling comprises a computer-readable storage medium for storing computer-readable program code which, when executed, causes a computer to perform the steps of obtaining data associated with an auction, with the obtained data comprising data corresponding to at least one bidder associated with the auction. The obtained data is analyzed, and at least one output is generated based on the analysis. The at least one output is sent to at least one device associated with the user. The at least one device is configured to generate at least one alert based on the at least one output, with the at least one alert providing decision support to the user with respect to bidding strategy.

For example, in yet another illustrative embodiment, an apparatus to provide bidding support to a user during an auction using cognitive modeling comprises at least one processor operatively coupled to memory, and a cognitive bidding engine associated with the user in communication with the at least one processor. The cognitive bidding engine is configured to obtain data associated with the auction, with the obtained data comprising data associated with at least one bidder. The obtained data is analyzed, and at least one output is generated based on the analysis. The at least one output is sent to at least one device associated with the user. The at least one device is configured to generate at least one alert based on the at least one output, with the at least one alert providing decision support to the user with respect to bidding strategy.

DETAILED DESCRIPTION

In illustrative embodiments, techniques are provided for vicinity based cognitive bidding. More particularly, illustrative embodiments provide data analytics techniques to adjust the bid response during an auction based on a surrounding bidder risk and profile analysis. As will be explained, the illustrative embodiments advantageously leverage demographic and physiological attributes from bidding users participating in an auction process to capture basic profile and physiological characteristics in order to perform personalized risk profile modeling.

Cognitive modeling is an area of computer science pertaining to the simulation of human problem solving and mental task processing through the use of cognitive models. Cognitive models are configured to continuously and/or dynamically learn from past interactions to refine future responses. In one embodiment, cognitive models may be enabled via a big data platform. The embodiments described herein provide for cognitive modeling techniques that provide bid support to a given bidder at an auction by processing information associated with the auction.

Figure 1:
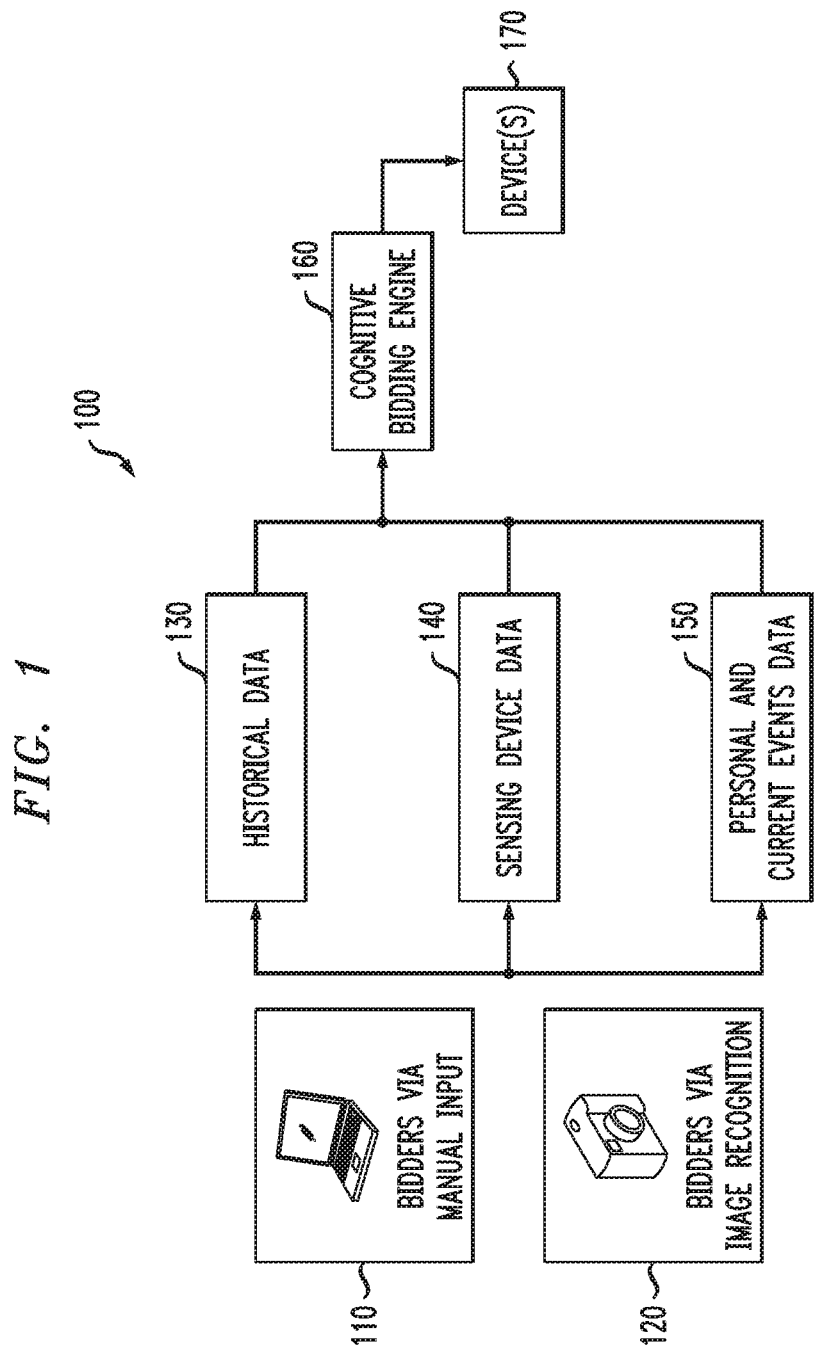
FIG. 1 depicts a block diagram illustrating an overview of vicinity based cognitive bidding, according to an embodiment of the invention.

With reference to FIG. 1, diagram 100 is provided illustrating an overview of vicinity based cognitive bidding, according to an embodiment of the invention. One or more bidders associated with an auction 110 ("bidders") are obtained as input. For example, the bidders may be received as manual input and/or via image recognition technology.

Data associated with the auction is discovered. This data may include historical data 130, sensing device data 140, and personal/current events data 150. Historical data 130 may include any historical data that may pertain to the item being auctioned. For example, historical data 120 may include previous bid data, relevant weather data, and relevant events at the time data. Historical data 130 may be obtained at least in part from one or more application programming interfaces (APIs). For example, relevant weather data may be obtained from a weather API. Sensing device data 140 may include data obtained in real-time or near real-time from one or more sensing devices placed in proximity to the auction. For example, sensing device data 140 may include body/physiological data, audio/video data, weather data, etc. Personal/current events data 150 may include social, political and/or economic data mined from one or more sources (e.g., Internet sources). For example, personal data may include social media data mined from one or more public/private (if authorized) social media accounts associated with a given bidder (e.g., determining preferences associated with the given bidder that may be relevant during the auction). Current events data may be mined via social media sensing (e.g., determining a share price decrease for a company associated with the item up for auction). Further details regarding data associated with the auction will be discussed herein with reference to FIG. 2.

The obtained data is analyzed, and cognitive bidding engine 160 is configured to convert the analyzed data into at least one output based on the analysis. In one embodiment, the least one output provides decision support with respect to a current bid associated with the given bidder. The at least one output is sent to one or more devices 170 associated with a user at the auction.

The at least one output may provide one or more of a visual, vibrational, and audio signal to provide decision support for the user. For example, the one or more devices may generate a visual alert, a vibrational alert, and/or an audio alert to provide decision support for the user. Examples of outputs include, but are not limited to, a mobile device vibrating at a certain amplitude for a given bidder when the temperature is low because the given bidder has a history of bidding only in warm environments, a mobile device changing color when a given bidder is perceived as very risk averse when competing against more than ten people, a certain sound generated (e.g., via headphones) when an affluent or aggressive bidder is bidding on the same item as you, etc.

Figure 2:
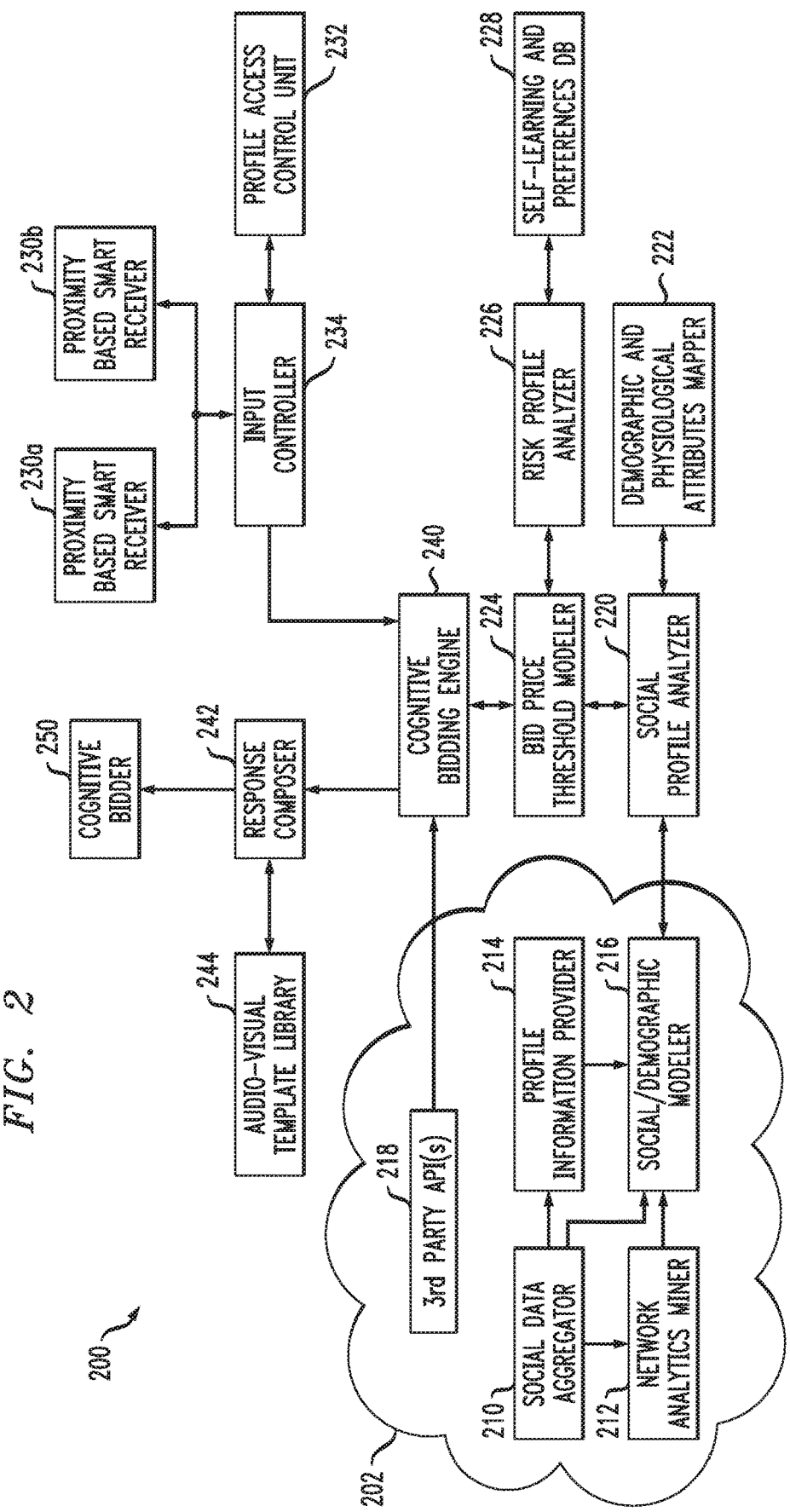
FIG. 2 depicts a block diagram illustrating an exemplary system to support vicinity based cognitive bidding, according to an embodiment, of the invention.

Further details regarding the overview of FIG. 1 will now be discussed with reference to FIG. 2. FIG. 2 depicts a block diagram illustrating a component model of a system 200 to support vicinity based cognitive bidding, in accordance with an embodiment of the invention. System 200 is shown comprising various components. Although the components of system 200 are shown as individual components, it is to be appreciated that the components of system 200 may be implemented as a single component, or as a combination of one or more sub-combinations of components. Accordingly, the representation of system 200 shown in FIG. 2 is not to be considered limiting.

System 200 is shown comprising subsystem 202. In one embodiment, subsystem 202 is a cloud server. Subsystem 202 is shown having various components, including social data aggregator 210, network analytics miner 212, profile information provider 214, social demographic modeler 216, and third party application programming interface(s) (API) 218.

Social data aggregator 210 is configured to aggregate or collect social data about one or more bidders associated with an auction. The aggregated social data may include public and/or (authorized) private data retrieved from one or more social media sources. For example, social data aggregator 210 may retrieve and aggregate social data from posts on social media accounts of the bidders (e.g., Twitter® and Facebook®).

The aggregated data from social data aggregator 210 is sent to network analytics miner 212 and profile information provider 214. In one embodiment, network analytics miner 212 is configured to form connections based on the aggregated social data. For example, the aggregated social data may be used to determine shopping preferences for the bidders associated with the auction. In one embodiment, profile information provider 214 is configured to determine information about one or more user profiles associated with the bidders associated with the auction. For example, profile information provider 214 may determine that a bidder associated with the auction has an online shopping profile or account (e.g., an Amazon® online shopping profile or account).

The data from social data aggregator 210, network analytics miner 212 and profile information provider 214 can be used to determine one or more behavioral patterns associated with the bidders. In one embodiment, and as shown, data from one or more of social data aggregator 210, network analytics miner 212 and profile information provider 214 is sent to social/demographic modeler 216. Social/demographic modeler 216 may be configured to generate a social/demographic model corresponding to each bidder associated with the auction based on the data received from social data aggregator 210, network analytics miner 212 and profile information provider 214. The social/demographic model may identify what kind of bidder each bidder is based on the data harvested from the various components. For example, if the aggregated data from social data aggregator 210 for a given bidder includes photos of expensive houses obtained from one or more social media sources, and if profile information provider 214 indicates that that the given bidder has one or more online accounts with real estate firms, social/demographic modeler 216 could extract insights that the given bidder is likely to spend money on an expensive house. Accordingly, system 200 is configured to generate a social/demographic model based on historical data associated with the bidders of an auction.

Third party API 218 may include one or more APIs configured to provide additional historical data relevant to the auction. For example, third party API 218 may provide historical information including weather history, events that may have impacted past bidding levels (e.g., social or political events), etc. The weather history may be relevant with regard to auctions pertaining to commodities that depend on weather (e.g., crops).

Social/demographic modeler 216 and demographic and physiological attributes mapper ("mapper") 222 are shown operatively coupled to social profiler analyzer 220. Mapper 222 is configured to classify and map demographic and physiological attributes for each bidder associated with the auction based on the social data determined from subsystem 202. Examples of demographic attributes include, but are not limited to, age, gender, marital status, dependent status, home owner status, car owner status, etc. Examples of physiological attributes may include attributes related to physiological or health attributes. For example, a physiological attribute for a given bidder may be that the given bidder has a heart problem that causes rapid breathing. Another physiological attribute for a given bidder may be that the given bidder has a stutter. Such information may be important in order to discern whether a physiological attribute detected at an auction (as will be discussed herein) is due to excitement at the auction or from underlying health issues.

Social profile analyzer 220 is an intermediary component that receives data from social/demographic modeler 216 and mapper 222, and analyzes a social profile of each bidder based on the received data. In one embodiment, social profile analyzer 220 performs a cognitive mapping of the social/demographic model to derive one or more behavioral traits that may influence the bidding process. For example, an "aggressive and vocal" personality of a given bidder may map to a characteristic corresponding to "firm and persistent" bidder.

Social profile analyzer 220 is shown operatively coupled to bid price threshold modeler (BPTM) 224. BPTM 224 is configured to generate an analytical model that receives data and determines one or more bid price thresholds associated with the bidders at the auction. A bid price threshold may be a maximum bid associated with a bidder. In one embodiment, BPTM 224 is configured to refine the likelihood of a bidder to raise or lower a bid. For example, the likelihood of a bidder to raise or a lower a bid may be based at least in part on the social data associated with the bidder.

Risk profile analyzer 226 is shown operatively coupled to bid price threshold modeler 224. Risk profile analyzer 226 is configured to analyze a risk that a prediction determined by the bid price threshold model may be incorrect. In one embodiment, risk profile analyzer 226 is configured to assign a confidence score to the prediction. For example, risk profile analyzer 226 may determine that there is a 40% chance that a prediction that a given bidder will bid $20 for an auction item is incorrect based on its analysis, and thus assign a 60% confidence score to that prediction. In one embodiment, self-learning and preferences database (DB) 228 is configured to implement one or more machine learning algorithms to update bidder data based on a success of the prediction, and risk profile analyzer 226 is configured to adjust the confidence score based on the updated bidder data. For example, if the given bidder does bid $20 for the auction item, self-learning and preferences DB 228 may update the bidder data accordingly, and risk profile analyzer 226 may use this updated data to increase the confidence score assigned to the given bidder for the auction item. Conversely, if the given bidder does not bid $20 for the auction item, risk profile analyzer 226 may decrease the confidence score assigned to the given bidder for the auction item. Further details regarding self-learning and preferences DB 228 are provided below. Accordingly, bid price predictions may be dynamically modified in real-time or near real-time based on bidder behavior.

System 200 may be configured to obtain inputs from physical sensors during the auction in real-time or near real-time. As shown, proximity based smart receivers ("smart receivers") 230a and 230b and profile access control unit 232 are operatively coupled to input controller 234. In one embodiment, smart receivers 230a and 230b are configured to obtain one or more of personal/physiological data and current weather data. For example, without loss of generality, smart receiver 230a may comprise at least one audio/video sensor to detect audio and visual characteristics associated with a bidder, and smart receiver 230b may comprise at least one feature sensor to detect current weather information (e.g., temperature, humidity, air pressure). The personal/physiological characteristics may be associated with, for example, rapid breathing, heated face, stuttering, shy demeanor, etc., which may provide information regarding bidder behavior and mindset. Thus, the audio/video sensor may be used to analyze bidder body language. Profile access control unit 232 is configured to enforce security and access control with respect to accessing profile information. For example, the security and access control may be based on privacy and/or confidentiality consent.

If smart receivers 230a and 230b pick up rapid breathing, heated face, stuttering, etc. from a given bidder, this may be irrelevant or misleading due one or more external factors unrelated to the auction, such as one or more underlying medical conditions, that are causing the sensed physiological response(s). To mitigate the incorporation of potentially false data in system 200, as discussed above, system 200 is configured to incorporate information related to such external factors, such as medical conditions, to discern whether or not the given bidder is having the sensed physiological response(s) due to bidding excitement, or due to the one or more external factors unrelated to the auction.

Cognitive bidding engine ("engine") 240 receives and processes data obtained from various components of system 200 (e.g., from third party API 218, BPTM 224 and input controller 234) to provide bidding support for the user. Engine 240 may be a vicinity based cognitive bidding engine. In one embodiment, engine 240 is configured determine a propensity of other bidders to bid for certain commodities and/or price thresholds. Engine 240 determines the most suitable response based on the risk profile analysis and bid price threshold model. In one embodiment, engine 240 creates an initial bidding strategy before the bidding process starts based on the historical data (e.g., demographic, social, history of biddings, preferences, weather, and events), and engine 240 dynamically updates or modifies the initial bidding strategy, in real-time or near real-time, based on dynamics of the bidding process. For example, the strategy may be modified if a bidder withdraws, an unexpected event occurs (e.g., a sudden crash in the market associated with a commodity being auctioned), or any event that may affect the bid price and/or bidding strategy during the auction.

Response composer 242 is configured to compose a response based on the determination made by engine 240, and send the response to vicinity based cognitive bidder 250. In one embodiment, the response is formatted based on the user. Audio-visual template library 244 is configured to render and modulate the response composed by response composer 242. For example, audio-visual template library 244 may render and modulate a response to raise a bid in an aggressive tone. Accordingly, engine 240 functions as an advisor for a user and, in conjunction with response composer 242 and audio-visual template library 244, generates a response or alert to take a bidding action based on the analyzed data.

System 200 may retrieve past preferences of the bidders from self-learning and preferences DB 228, and use the retrieved past preferences in determining the next suitable response. In one embodiment, self-learning and preferences DB 228 uses one or more machine learning algorithms to improve one or more modeling processes of system 200. For example, one or more models may be reinforced if a prediction determined based on the one or more models is successful. As previously discussed, data from self-learning preferences DB 228 may be used to adjust a confidence score assigned by risk profile analyzer 226. Accordingly, system 200 may be configured to implement one or more machine learning algorithms to learn from historical data to fine-tune vicinity based cognitive bidding. Accordingly, the system of FIG. 2 may be configured to provide a responsive cognitive interface (e.g., as a virtual participant) that executes a next best response based on past experience.

In one embodiment, system 200 is configured to determine bid strength based on a bid price prediction and a surrounding participant mood analysis. For example, the aggressiveness of the bid may be adjusted based on the prediction of bid price threshold modeler 224 and the surrounding participant mood analysis determined based on proximity based smart receivers 234a and 234b.

System 200 may be configured to qualify one or more commodities in the bidding cycle by various means. In one embodiment, system 200 is configured to qualify one or more commodities in the bidding cycle by computing a "commodity to threshold ratio." For example, perishable goods, including flowers, fruit, etc., may be assigned a threshold value of 1 day. The commodity to threshold ratio may be implemented by bid price threshold modeler 224 in order to dynamically adjust the bid price threshold associated with the one or more commodities in the bidding cycle.

In one embodiment, system 200 is configured to qualify one or more commodities in the bidding cycle by using one or more external real-time and/or near real-time data sources. For example, the one or more external real-time and/or near real-time data sources may comprise third party API 218. For example, if the one or more external real-time and/or near real-time data sources determine that it is currently a rainy season, items such as umbrellas, raincoats, etc. may be qualified in the bidding cycle accordingly. As another example, if the one or more external real-time and/or near real-time data sources determine that there has been a flu outbreak, items such as flu medication may be qualified in the bidding cycle accordingly.

In one embodiment, system 200 is configured to dynamically qualify one or more commodities based on a present level of interest. For example, a customer inquiry may be automatically or manually sensed, and a present level of interest may be determined based on the customer inquiry. Based on the present level of interest, the one or more commodities may be qualified in the bidding cycle accordingly. In one embodiment, the determination of the present level of interest is performed in real-time or near real-time.

As discussed, the system of FIG. 2 may be configured capture basic profile and physiological data by retrieving, via integration of smart sensors with mobile/wearable devices carried by the user, demographic and physiological data from bidding users participating in an auction process in order to perform personalized risk profile modeling. In one embodiment, the physiological data may be used to assess a risk profile of individuals in the vicinity for use in generating the cognitive model. For example, video-based mood/stress data of auction participants may be compared against historical data to predict bid stretch thresholds.

The system of FIG. 2 may implement time-based fatigue propensity to further optimize the response sent to vicinity based cognitive bidder 250. The time-based fatigue propensity may include, for example, information suggesting when a bidder at the auction is likely to "bow out" (e.g., information suggesting what the maximum bid of the bidder is for the given auction item). The time-based fatigue propensity may be used to predict a personalized fatigue model using public and/or authorized private social attributes associated with the bidders at the auction. Additionally, social characteristics of the bidders, including ethnicity, culture, mannerisms, etc., may be used to predict personalized fatigue thresholds associated with the personalized fatigue model.

An illustrative scenario describing an exemplary implementation of the cognitive bidding system of FIG. 2 will now be provided. Let us assume Carl is a bidder at an auction for a DSLR camera lens. Carl has an aggressive personality as per behavior traits, and is an avid wildlife photographer who has recently purchased a DSLR camera. The components of subsystem 202 may have captured information regarding, for example, Carl's age, social behavior (e.g., aggressive personality), interests (e.g., wildlife photography), recent purchases (e.g., the DSLR camera), etc. to create a social/demographic model for Carl. For example, this information may have been obtained from social media networks, online shopping profiles, etc. associated with Carl. Social profile analyzer 220 may then obtain and filter data (e.g., time, location and events) from the social/demographic model, and segment the data for further use. Capturing the information may use natural language interpretation and classification techniques on structured and/or unstructured data to perform user characteristic-to-action mapping. For example, natural language processing techniques may be used to map one or more of textual, audio and video information to relevant attributes, which may then be tagged to a sequence of events. Here, keywords such as "trip planned," "wildlife," etc. may be tagged based on the information that Carl purchased a DSLR camera and is interested in wildlife photography.

Bid price threshold modeler 224 may set a threshold price for the DSLR camera lens that Carl intends to bid on during the auction. Engine 240 may then determine that Carl needs the DSLR lens based on learning about Carl's recent purchase of a DSLR camera and his hobby as a wildlife photographer and will provide a customized bid response to Carl in combination with the information regarding Carl's aggressive personality and the threshold price. Self-learning and preferences DB 228 may then determine a next best course of action, which may be used by engine 240 to provide the next customized bid response (if necessary).

Figure 3:
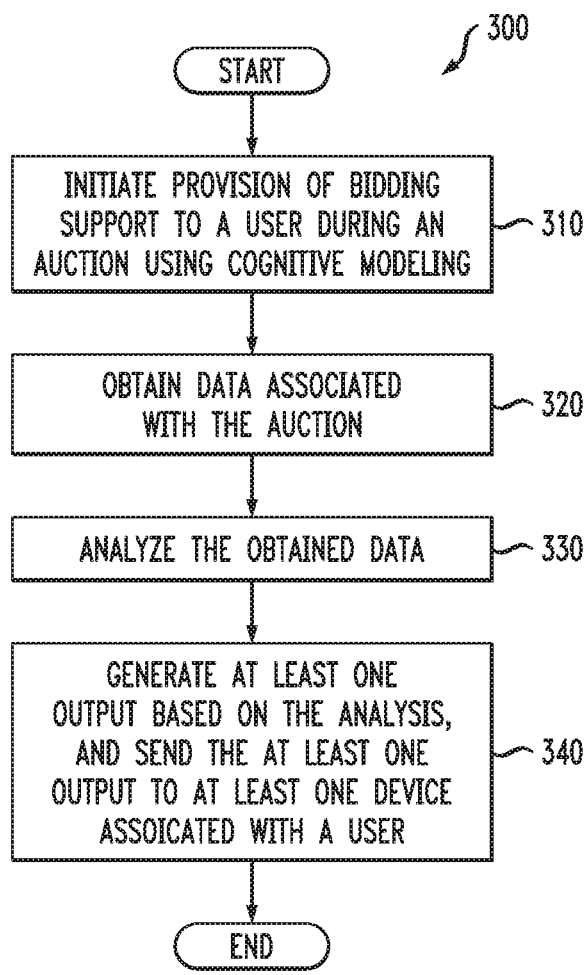
FIG. 3 depicts a flow chart illustrating a process for supporting vicinity based cognitive bidding, according to an embodiment of the invention.

With reference to FIG. 3, flow diagram 300 is provided illustrating a process for vicinity based cognitive bidding. Additional details regarding the steps of the process described in FIG. 3 are provided above with reference to FIGS. 1 and 2. At step 310, the provision of bidding support to a user during an auction using cognitive modeling is initiated. At step 320, data associated with the auction is obtained. At step 330, the obtained data is analyzed. At step 340, at least one output is generated based on the analysis, and the at least one output is sent to at least one device associated with the user. The at least one device is configured to generate at least one alert based on the at least one output. In one embodiment, the at least one generated alert comprises at least one of a vibrational alert, a visual alert, and an audio alert.

Figure 4:
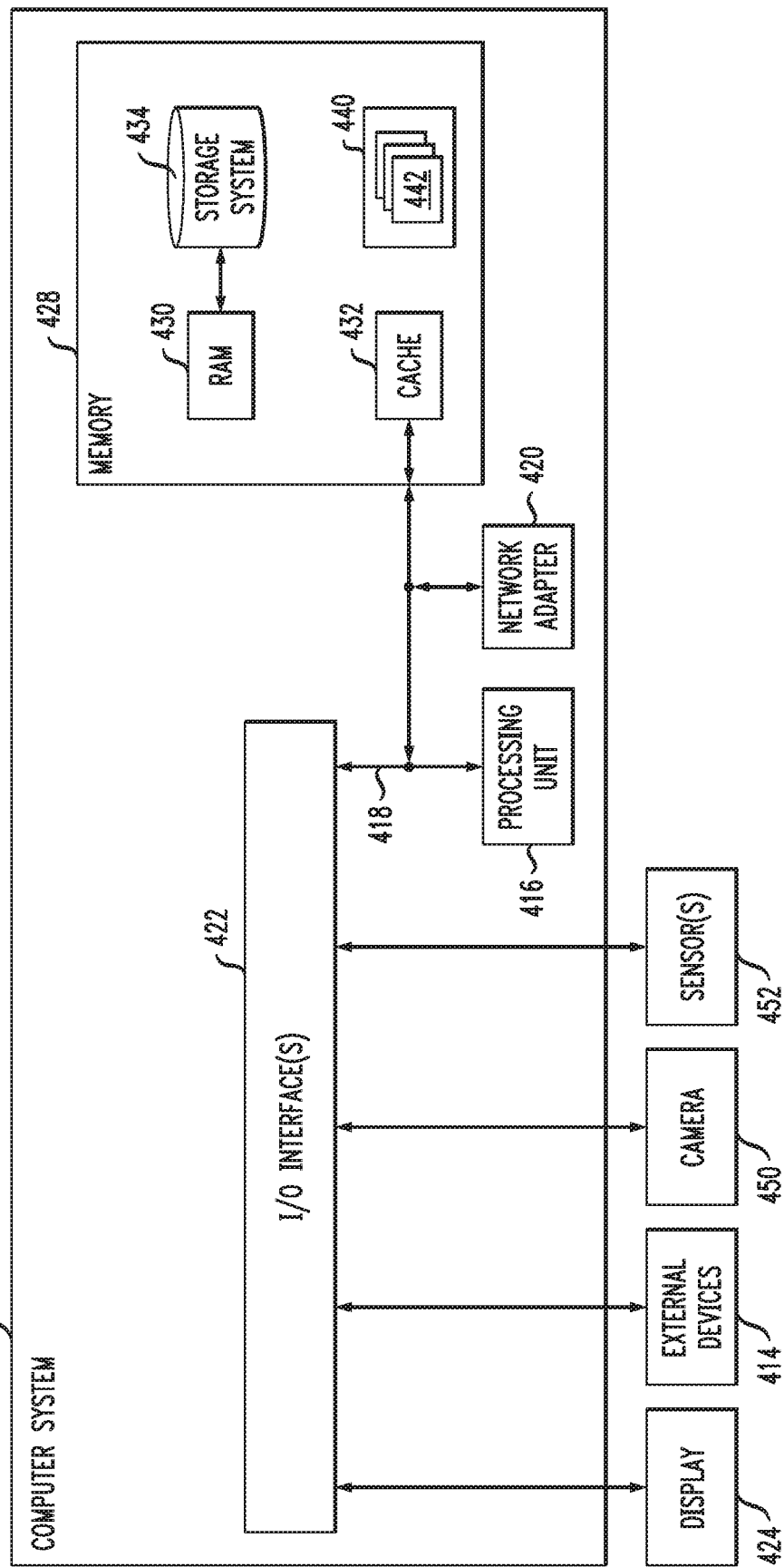
FIG. 4 depicts a computer system in accordance with which one or more components/steps of techniques of the invention may be implemented, according to an embodiment of the invention.

One or more embodiments can make use of software running on a computer or workstation. With reference to FIG. 4, in a computing node 410 there is a system/server 412, which is operational with numerous other general purpose or special purpose computing system environments or configurations. Examples of well-known computing systems, environments, and/or configurations that may be suitable for use with system/server 412 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

System/server 412 may be described in the general context of computer system executable instructions, such as program modules, being executed by a computer system. Generally, program modules may include routines, programs, objects, components, logic, data structures, and so on that perform particular tasks or implement particular abstract data types. System/server 412 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 4, system/server 412 is shown in the form of a computing device. The components of system/server 412 may include, but are not limited to, one or more processors or processing units 416, system memory 428, and bus 418 that couples various system components including system memory 428 to processor 416.

Bus 418 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

System/server 412 typically includes a variety of computer system readable media. Such media may be any available media that is accessible by system/server 412, and it includes both volatile and non-volatile media, removable and non-removable media.

The system memory 428 can include computer system readable media in the form of volatile memory, such as random access memory (RAM) 430 and/or cache memory 432. System/server 412 may further include other removable/non-removable, volatile/nonvolatile computer system storage media. By way of example only, storage system 434 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 418 by one or more data media interfaces.

As depicted and described herein, memory 428 may include at least one program product having a set (e.g., at least one) of program modules that are configured to carry out the functions of embodiments of the invention. A program/utility 440, having a set (at least one) of program modules 442, may be stored in memory 428 by way of example, and not limitation, as well as an operating system, one or more application programs, other program modules, and program data. Each of the operating system, one or more application programs, other program modules, and program data or some combination thereof, may include an implementation of a networking environment. Program modules 442 generally carry out the functions and/or methodologies of embodiments of the invention as described herein.

System/server 412 may also communicate with one or more external devices 414 such as a keyboard, a pointing device, an external data storage device (e.g., a USB drive), display 424, camera 450, sensor(s) 452, one or more devices that enable a user to interact with system/server 412, and/or any devices (e.g., network card, modem, etc.) that enable system/server 412 to communicate with one or more other computing devices. In one embodiment, camera 450 is configured to capture an image of one or more bidders from an auction, and generate a list of the one or more bidders by processing the image. In one embodiment, sensor(s) 452 are configured to obtain data associated with the auction. For example, sensor(s) 452 may be configured to obtain physiological data and current weather, as described with reference to FIG. 2. Such communication can occur via I/O interfaces 422. Still yet, system/server 412 can communicate with one or more networks such as a LAN, a general WAN, and/or a public network (e.g., the Internet) via network adapter 420. As depicted, network adapter 420 communicates with the other components of system/server 412 via bus 418. It should be understood that although not shown, other hardware and/or software components could be used in conjunction with system/server 412. Examples include, but are not limited to, microcode, device drivers, redundant processing units, external disk drive arrays, RAID systems, tape drives, and data archival storage systems, etc.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 5:
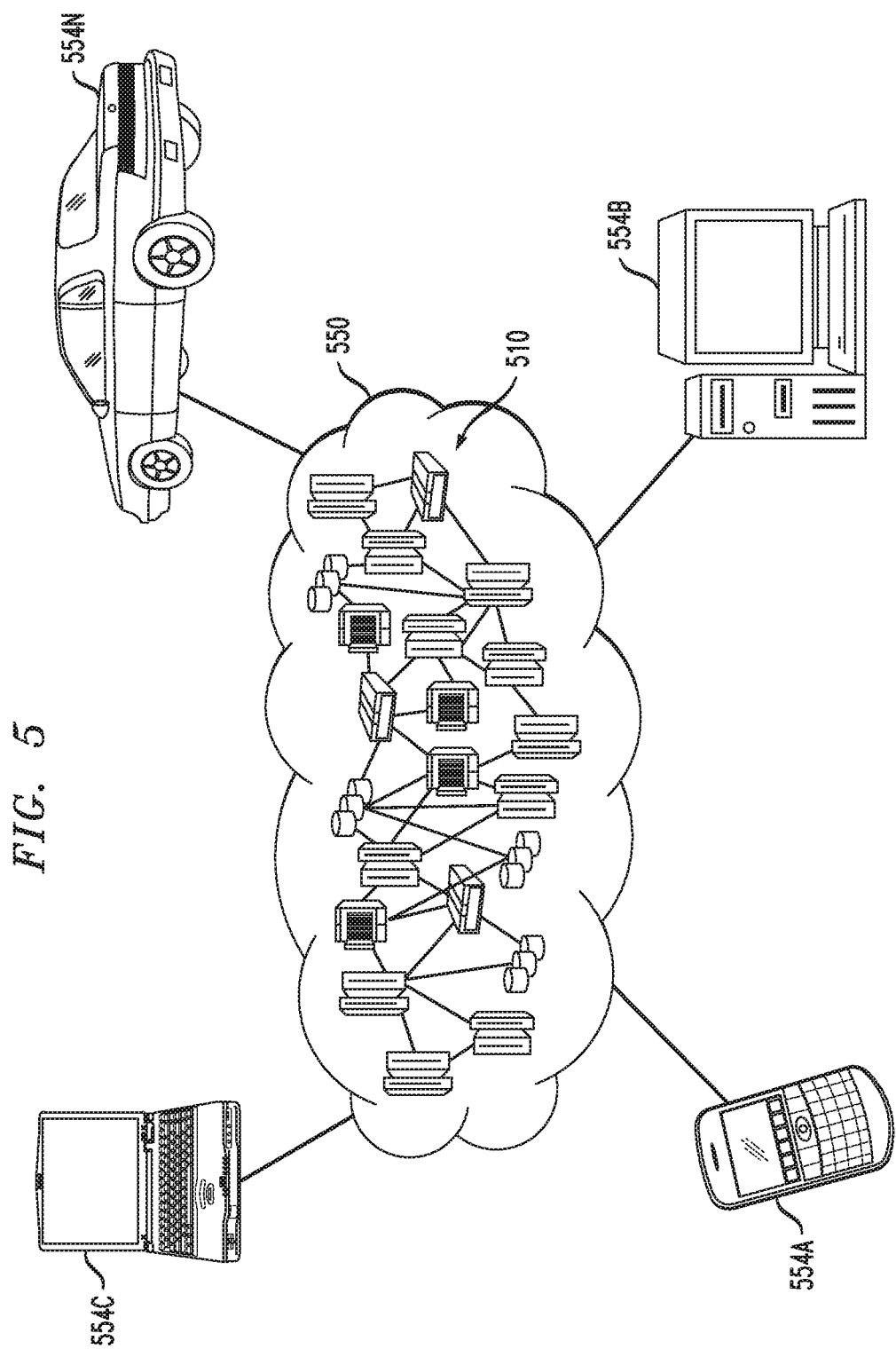
FIG. 5 depicts a cloud computing environment, according to an embodiment of the invention.

Referring now to FIG. 5, illustrative cloud computing environment 550 is depicted. As shown, cloud computing environment 550 includes one or more cloud computing nodes 510 with which local computing devices used by cloud consumers, such as, for example, personal digital assistant (PDA) or cellular telephone 554A, desktop computer 554B, laptop computer 554C, and/or automobile computer system 554N may communicate. Nodes 510 may communicate with one another. They may be grouped (not shown) physically or virtually, in one or more networks, such as Private, Community, Public, or Hybrid clouds as described hereinabove, or a combination thereof. This allows cloud computing environment 550 to offer infrastructure, platforms and/or software as services for which a cloud consumer does not need to maintain resources on a local computing device. It is understood that the types of computing devices 554A-N shown in FIG. 5 are intended to be illustrative only and that computing nodes 510 and cloud computing environment 550 can communicate with any type of computerized device over any type of network and/or network addressable connection (e.g., using a web browser).

Figure 6:
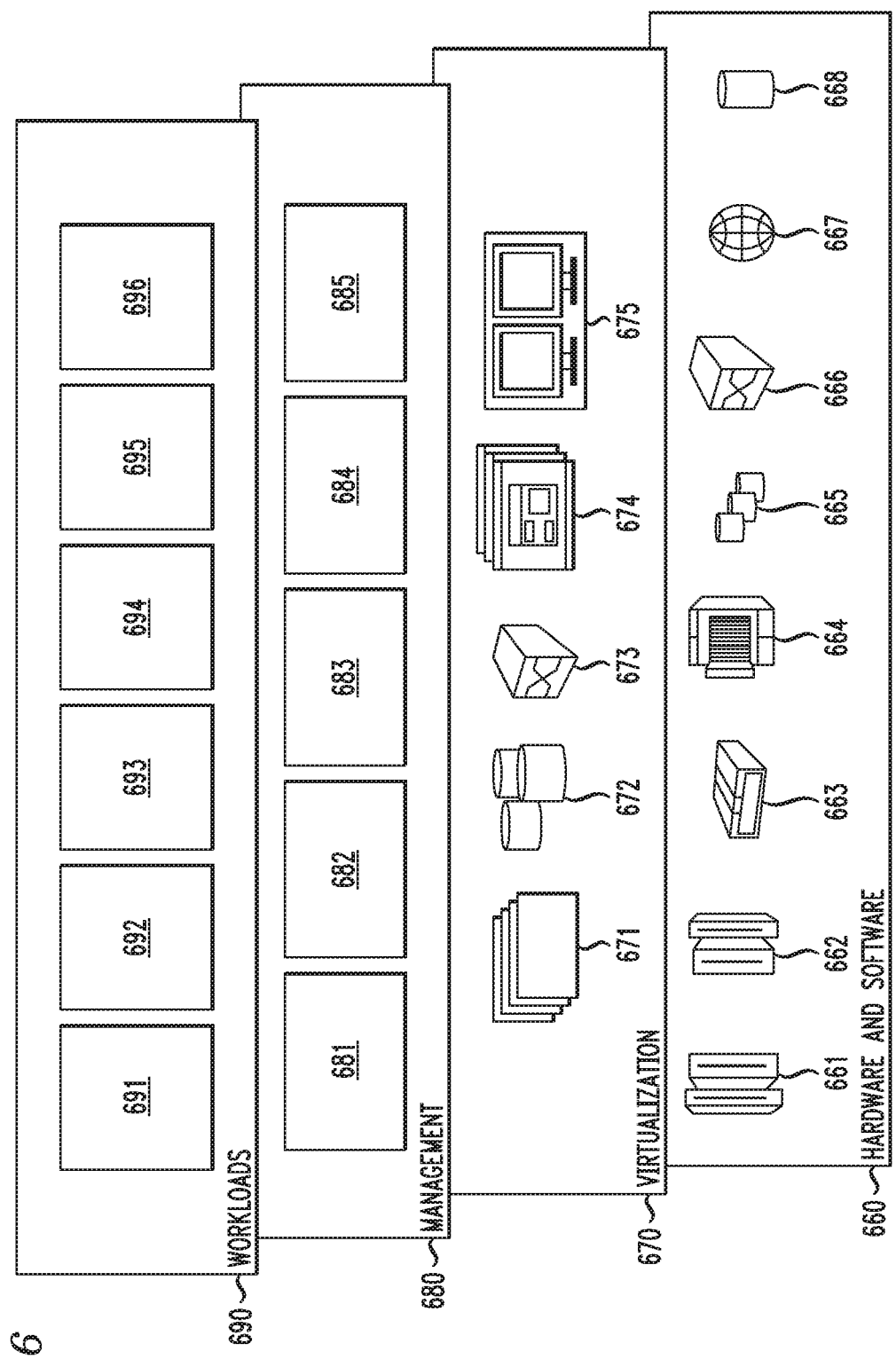
FIG. 6 depicts abstraction model layers, according to an embodiment of the present invention.

Referring now to FIG. 6, a set of functional abstraction layers provided by cloud computing environment 550 (FIG. 5) is shown. It should be understood in advance that the components, layers, and functions shown in FIG. 6 are intended to be illustrative only and embodiments of the invention are not limited thereto. As depicted, the following layers and corresponding functions are provided:

Hardware and software layer 660 includes hardware and software components. Examples of hardware components include: mainframes 661; RISC (Reduced Instruction Set Computer) architecture based servers 662; servers 663; blade servers 664; storage devices 665; and networks and networking components 666. In some embodiments, software components include network application server software 667 and database software 668.

Virtualization layer 670 provides an abstraction layer from which the following examples of virtual entities may be provided: virtual servers 671; virtual storage 672; virtual networks 673, including virtual private networks; virtual applications and operating systems 674; and virtual clients 675.

In one example, management layer 680 may provide the functions described below. Resource provisioning 681 provides dynamic procurement of computing resources and other resources that are utilized to perform tasks within the cloud computing environment. Metering and Pricing 682 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 683 provides access to the cloud computing environment for consumers and system administrators. Service level management 684 provides cloud computing resource allocation and management such that required service levels are met. Service Level Agreement (SLA) planning and fulfillment 685 provide pre-arrangement for, and procurement of, cloud computing resources for which a future requirement is anticipated in accordance with an SLA.

Workloads layer 690 provides examples of functionality for which the cloud computing environment may be utilized. Examples of workloads and functions which may be provided from this layer include: mapping and navigation 691; software development and lifecycle management 692; virtual classroom education delivery 693; data analytics processing 694; transaction processing 695; and vicinity based cognitive bidding support 696, which may perform various functions described above.

The embodiments described herein advantageously provide for vicinity based bidding support during an auction using cognitive modeling techniques. For example, the embodiments described herein advantageously leverage data obtained from various sources, such as social media, sensor data, and other external data sources, in order to optimize bidding strategy during an auction by collecting and interpreting data that may impact bidding strategy during the auction (e.g., data related to the bidder(s), the auction item(s), etc.). An alert may be generated to a user in real-time, or near real-time, based on output generated from an analysis of the obtained data, in order to suggest or recommend a particular bidding strategy. Advantageously, the analysis comprises utilizing cognitive modeling techniques to generate and implement one or more cognitive models. The embodiments described herein can allow for an adjustment of the one or more cognitive models, in real-time or near real-time, based on one or more observations made during the auction, such as feedback obtained in response to a success or failure in predicting a given bidder's bidding behavior.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Although illustrative embodiments have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A computer-implemented method comprising:
providing, by a cognitive bidding engine associated with a user, bidding support to the user during an auction using cognitive modeling, wherein providing bidding support using cognitive modeling comprises:
obtaining an initial bidding strategy for the user;
generating sensor data in real-time or near real-time by at least one sensing device located in physical proximity to the auction, the sensor data comprising at least one of audio data, video data and physiological data;
determining, based at least in part on the sensor data, a physiological state of at least one bidder at the auction, the at least one bidder being different than the user;
obtaining external factor data associated with the at least one bidder from at least one source external to the auction;
obtaining historical data comprising at least one of bid history data, relevant weatherdata, and relevant historical event data;
determining, based at least in part on the obtained external factor data, whether or not the determined physiological state of the at least one bidder is a physiological response of the at least one bidder to the auction;
analyzing at least a portion of the generated sensor data, obtained external factor data and obtained historical data to determine a bid price threshold for the at least one bidder, wherein determining the bid price threshold for the given bidder comprises predicting the bid price threshold, and assigning a confidence score to the prediction;
adjusting the bid price threshold for the at least one bidder based on a success of the prediction via at least one machine learning algorithm;
in response to determining that the determined physiological state of the at least one bidder is a physiological response of the at least one bidder to the auction, updating the initial bidding strategy based at least in part on the determined physiological state of the at least one bidder and the adjusted bid price threshold to generate an updated bidding strategy;
generating at least one output based at least in part on the updated bidding strategy; and
providing the at least one generated output to at least one device associated with the user,
wherein the at least one device is configured to generate at least one alert based at least in part on the at least one output, and wherein the at least one alert provides decision support to the user with respect to bidding strategy;
wherein the cognitive bidding engine is in communication with at least one processing device operatively coupled to memory.

2. The method of claim 1,
wherein the generated sensor data further comprises current weather data associated with at least one weather related attribute of the auction; and
wherein the obtained external factor data associated with the at least one bidder comprises personal data, the personal data comprising at least one of preference data, medical data and social data.

3. The method of claim 2, wherein the social data is obtained based on an analysis of social media data associated with the at least one bidder.

4. The method of claim 2, wherein the relevant historical event data comprises data obtained via one or more application programming interfaces (APIs).

5. The method of claim 2, wherein the preference data is obtained from a self-learning and preferences database.

6. The method of claim 2, wherein the current events data is obtained via social media data mining.

7. The method of claim 1, further comprising determining a bid strength based at least in part on the bid price threshold.

8. The method of claim 2, further comprising performing risk profile modeling associated with the at least one user based at least in part on the physiological data.

9. The method of claim 8, wherein performing the risk profile modeling comprises comparing at least a portion of the physiological data against the relevant historical event data to predict one or more bid stretch thresholds.

10. The method of claim 2, wherein obtaining the initial bidding strategy comprises generating the initial bidding strategy based at least in part on at least a portion of one or more of the obtained data historical data, obtained external factor data and generated sensor data, and wherein updating the initial bidding strategy comprises dynamically updating the initial bidding strategy during the auction based at least in part on at least a portion of one or more of the obtained data historical data, obtained external factor data and generated sensor data.

11. The method of claim 10, wherein the initial bidding strategy is dynamically updated during the auction in response to an occurrence of an event during the auction related to the at least one bidding strategy.

12. The method of claim 1, further comprising qualifying one or more commodities associated with the auction.

13. The method of claim 12, wherein qualifying the one or more commodities comprises dynamically adjusting a bid price threshold associated with the one or more commodities.

14. The method of claim 1, wherein the at least one generated alert comprises an alert selected from the group consisting of: a vibrational alert, a visual alert and an audio alert.

15. An article of manufacture comprising a computer-readable storage medium for storing computer-readable program code which, when executed, causes a computer to perform the steps of:
providing, by a cognitive bidding engine associated with a user, bidding support to the user during an auction using cognitive modeling, wherein providing bidding support using cognitive modeling comprises:
obtaining an initial bidding strategy for the user;
generating sensor data in real-time or near real-time by at least one sensing device located in physical proximity to the auction; the sensor data comprising at least one of audio data, video data and physiological data;
determining, based at least in part on the sensor data, a physiological state of at least one bidder at the auction, the at least one bidder being different than the user;
obtaining external factor data associated with the at least one bidder from at least one source external to the auction;
obtaining historical data comprising at least one of bid history data, relevant weather data, and relevant historical event data;
determining, based at least in part on the obtained external factor data, whether or not the determined physiological state of the at least one bidder is a physiological response of the at least one bidder to the auction;
analyzing at least a portion of the generated sensor data, obtained external factor data and obtained historical data to determine a bid price threshold for the at least one bidder, wherein determining the bid price threshold for the given bidder comprises predicting the bid price threshold, and assigning a confidence score to the prediction;
adjusting the bid price threshold for the at least one bidder based on a success of the prediction via at least one machine learning algorithm;
in response to determining that the determined physiological state of the at least one bidder is a physiological response of the at least one bidder to the auction, updating the initial bidding strategy based at least in part on the determined physiological state of the at least one bidder and the adjusted bid price threshold to generate an updated bidding strategy;
generating at least one output based at least in part on the updated bidding strategy; and
providing the at least one generated output to at least one device associated with the user, wherein the at least one device is configured to generate at least one alert based at least in part on the at least one output, and wherein the at least one alert provides decision support to the user with respect to bidding strategy.

16. An apparatus comprising:
at least one processor operatively coupled to at least one memory; and
a cognitive bidding engine in communication with the processor, wherein the cognitive bidding engine is associated with a user and configured to provide bidding support to the user during an auction using cognitive modeling;
at least one sensing device located in physical proximity to the auction and configured to generate sensor data comprising at least one of audio data, video data and physiological data in real-time or near real-time;
wherein the cognitive bidding engine is configured to:
determine, based at least in part on the sensor data, a physiological state of at least one bidder at the auction, the at least one bidder being different than the user;
obtain external factor data associated with the at least one bidder from at least one source external to the auction;
obtain historical data comprising at least one of bid history data, relevant weather data, and relevant historical event data;
determine, based at least in part on the obtained external factor data, whether or not the determined physiological state of the at least one bidder is a physiological response of the at least one bidder to the auction;
analyze at least a portion of the generated sensor data, obtained external factor data and obtained historical data to determine a bid price threshold for the at least one bidder, wherein determining the bid price threshold for the given bidder comprises predicting the bid price threshold, and assigning a confidence score to the prediction;
adjust the bid price threshold for the at least one bidder based on a success of the prediction via at least one machine learning algorithm;
in response to determining that the determined physiological state of the at least one bidder is a physiological response of the at least one bidder to the auction, updating the initial bidding strategy based at least in part on the determined physiological state of the at least one bidder and the adjusted bid price threshold to generate an updated bidding strategy;
generate at least one output based at least in part on the updated bidding strategy; and
provide the at least one generated output to at least one device associated with the user, wherein the at least one device is configured to generate at least one alert based at least in part on the at least one output, and wherein the at least one alert provides decision support to the user with respect to bidding strategy.

17. The method of claim 1, wherein the physiological state of the at least one bidder comprises at least one of a body language used by the at least one bidder, a physical attribute of the at least one bidder and a verbal attribute of the at least one bidder.

18. The apparatus of claim 16, wherein the cognitive bidding engine is further configured to qualify one or more commodities associated with the auction.

19. The apparatus of claim 18, wherein qualifying the one or more commodities comprises dynamically adjusting a bid price threshold associated with the one or more commodities.

20. The apparatus of claim 16, wherein the at least one generated alert comprises an alert selected from the group consisting of: a vibrational alert, a visual alert and an audio alert.

* * * * *